United States Patent
Brandl et al.

(10) Patent No.: US 10,198,204 B2
(45) Date of Patent: Feb. 5, 2019

(54) SELF REFRESH STATE MACHINE MOP ARRAY

(71) Applicant: Advanced Micro Device, Inc., Sunnyvale, CA (US)

(72) Inventors: Kevin M. Brandl, Austin, TX (US); Thomas H. Hamilton, Manor, TX (US)

(73) Assignee: Advanced Micro Devices, Inc., Santa Clara, CA (US)

(*) Notice: Subject to any disclaimer, the term of this patent is extended or adjusted under 35 U.S.C. 154(b) by 191 days.

(21) Appl. No.: 15/170,872

(22) Filed: Jun. 1, 2016

(65) Prior Publication Data

US 2017/0351450 A1    Dec. 7, 2017

(51) Int. Cl.
| | |
|---|---|
| *G06F 3/06* | (2006.01) |
| *G11C 11/406* | (2006.01) |
| *G11C 11/4074* | (2006.01) |
| *G11C 5/14* | (2006.01) |
| *G11C 11/34* | (2006.01) |
| *G11C 29/04* | (2006.01) |

(52) U.S. Cl.
CPC .......... *G06F 3/0629* (2013.01); *G06F 3/0604* (2013.01); *G06F 3/0625* (2013.01); *G06F 3/0673* (2013.01); *G11C 5/14* (2013.01); *G11C 11/34* (2013.01); *G11C 11/4074* (2013.01); *G11C 11/40615* (2013.01); *G11C 2029/0411* (2013.01); *G11C 2207/2227* (2013.01)

(58) Field of Classification Search
CPC .... G06F 3/0629; G06F 3/0604; G06F 3/0625; G06F 3/0673
See application file for complete search history.

(56) References Cited

U.S. PATENT DOCUMENTS

| | | | |
|---|---|---|---|
| 8,683,166 B1 | 3/2014 | Flateau, Jr. et al. | |
| 2006/0174142 A1* | 8/2006 | Lin ........................ | G06F 1/3203 713/300 |
| 2009/0172439 A1* | 7/2009 | Cooper ................. | G06F 1/3203 713/323 |

(Continued)

FOREIGN PATENT DOCUMENTS

WO    2013100909 A1    7/2013

OTHER PUBLICATIONS

International Search Report and Written Opinion for International Application No. PCT/US2016/053338, dated Mar. 31, 2017, 14 pages.

*Primary Examiner* — Austin Hicks
(74) *Attorney, Agent, or Firm* — Polansky & Associates, P.L.L.C.; Paul J. Polansky

(57) ABSTRACT

In one form, a memory controller includes a controller and a memory operation array. The controller has an input for receiving a power state change request signal and an output for providing memory operations. The memory operation array comprises a plurality of entries, each entry comprising a plurality of encoded fields. The controller is responsive to an activation of the power state change request signal to access the memory operation array to fetch at least one entry, and to issue at least one memory operation indicated by the entry. In another form, a system comprises a memory system and a processor coupled to the memory system. The processor is adapted to access the memory module using such a memory controller.

20 Claims, 6 Drawing Sheets

(56) References Cited

U.S. PATENT DOCUMENTS

| | | | |
|---|---|---|---|
| 2010/0005212 A1* | 1/2010 | Gower | G06F 13/4234 710/308 |
| 2010/0162020 A1 | 6/2010 | Maule et al. | |
| 2013/0262792 A1 | 10/2013 | Barth, Jr. et al. | |
| 2015/0103610 A1 | 4/2015 | Ellis et al. | |

* cited by examiner

SELF REFRESH STATE MACHINE MOP ARRAY

FIELD

This disclosure relates generally to data processing systems, and more specifically to memory controllers for data processing systems that interface with memory having low power states.

BACKGROUND

Computer systems typically use inexpensive and high density dynamic random access memory (DRAM) chips for main memory. Most DRAM chips sold today are compatible with various double data rate (DDR) DRAM standards promulgated by the Joint Electron Devices Engineering Council (JEDEC). DDR DRAMs offer both high performance and low power operation by providing various low power modes. One of these low power modes is known as precharge power down. During precharge power down, all banks are precharged, an on-chip delay locked loop (DLL) can be disabled, an input clock can be turned off, and output buffers can be disabled to significantly reduce power consumption. Precharge power down is relatively quick to exit, and exit time may be speeded up by keeping the DLL running.

It is desirable for memory controllers to support the variety of possible DDR memory devices on the market today. For example, DDR version three (DDR3), DDR version four (DDR4), low power (LP) DDR3 (LPDDR3), LPDDR4, and graphics DDR version five (gDDR5) are all currently available choices. However each different DDR memory device has different sets of mode registers (MRs), may have different numbers of and configurations of memory banks, and may support different low-power modes. Thus it has been difficult to design a single memory controller to support low power modes for all these variations efficiently.

Figure 1:
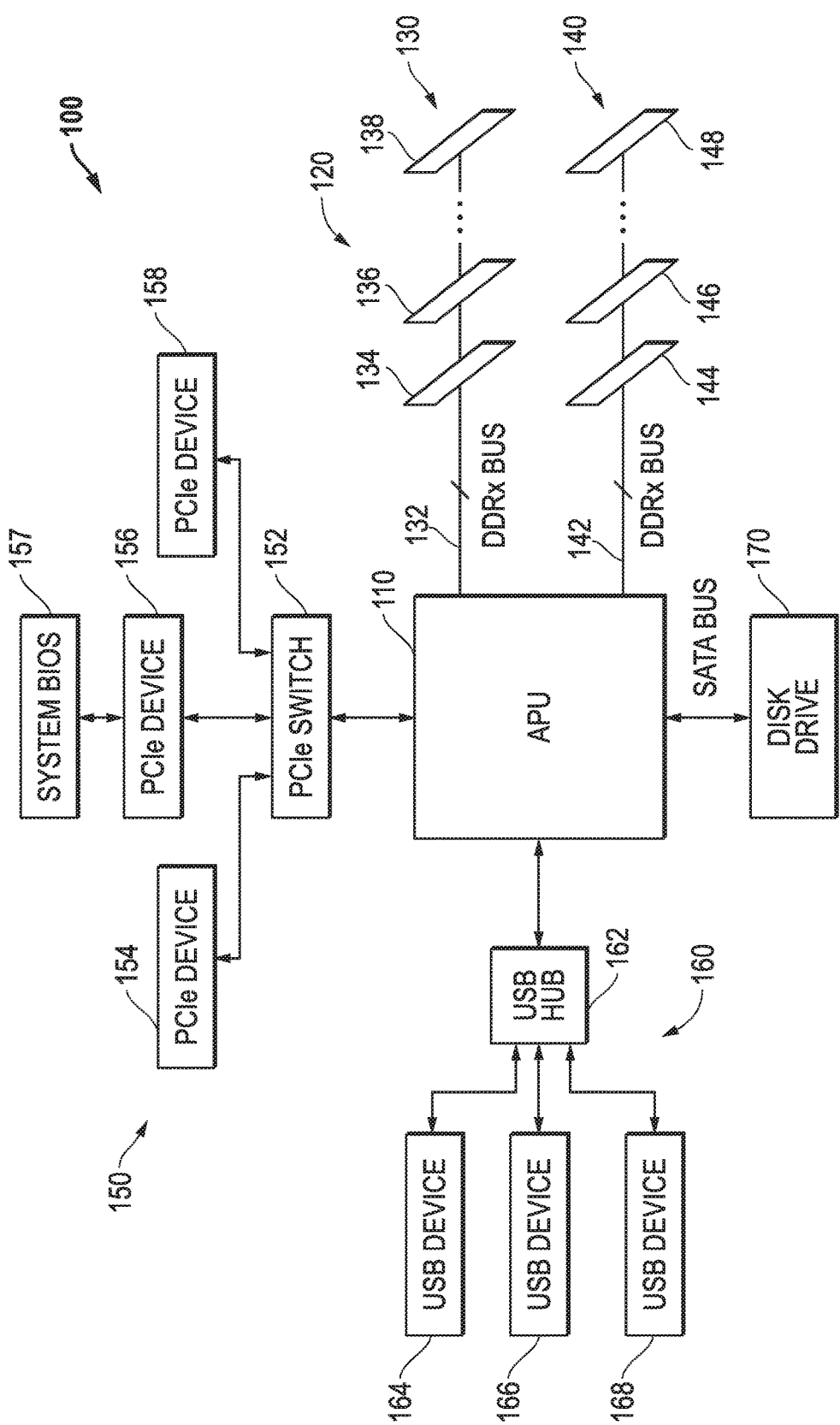
FIG. 1 illustrates in block diagram form a data processing system according to some embodiments.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

As will be described below, a memory controller includes a controller and a memory operation (MOP) array. The controller has an input for receiving a power state change request signal and an output for providing memory operations. The MOP array comprises a plurality of entries, each entry comprising a plurality of encoded fields. The controller is responsive to an activation of the power state change request signal to access the MOP array to fetch at least one entry, and to issue at least one memory operation indicated by the entry. The memory controller can, for example, have portions of the MOP array that described specific memory operations used to implement a power state change request. For example, DDR4 and LPDDR4 DRAMs implement different state machines and different low power modes, and require different sequences to move from an active state to a low power state. In one case, the memory controller can use the MOP array to define commands to be written to a register control word (RCW) or a buffer control word (BCW) of a DDR registered DIMM.

In another form, such a memory controller can be included in a processor of a processing system including the processor and a memory module. The processor may further include a physical interface (PHY) coupled between the memory controller and the memory system.

In yet another form, a method for controlling a power state of a memory system is disclosed. A power state change signal is received. A memory operation (MOP) array is accessed in response to the power state change request signal. An entry of the MOP array is decoded into at least one memory operation. Each memory operation, so decoded, is outputted. The decoding and outputting are repeated for successive entries in the MOP array until a predetermined termination condition occurs. The predetermined termination condition may be, for example, a null entry in the MOP array. The received power state change request signal may be a change from an active state to a low power state such as precharge power down, self refresh power down, or idle power down, or could be a change from one operation frequency to another operation frequency in an active state. A basic input/output system (BIOS) can also program the MOP array in response to detecting characteristics of the memory system.

FIG. 1 illustrates in block diagram form a data processing system 100 according to some embodiments. Data processing system 100 includes generally a data processor 110 in the form of an accelerated processing unit (APU), a memory system 120, a peripheral component interconnect express (PCIe) system 150, a universal serial bus (USB) system 160, and a disk drive 170. Data processor 110 operates as the central processing unit (CPU) of data processing system 100 and provides various buses and interfaces useful in modern computer systems. These interfaces include two double data rate (DDRx) memory channels, a PCIe root complex for connection to a PCIe link, a USB controller for connection to a USB network, and an interface to a Serial Advanced Technology Attachment (SATA) mass storage device.

Memory system 120 includes a memory channel 130 and a memory channel 140. Memory channel 130 includes a set of dual inline memory modules (DIMMs) connected to a DDRx bus 132, including representative DIMMs 134, 136, and 138 that in this example correspond to separate ranks. Likewise memory channel 140 includes a set of DIMMs connected to a DDRx bus 142, including representative DIMMs 144, 146, and 148.

PCIe system 150 includes a PCIe switch 152 connected to the PCIe root complex in data processor 110, a PCIe device 154, a PCIe device 156, and a PCIe device 158. PCIe device 156 in turn is connected to a system basic input/output system (BIOS) memory 157. System BIOS memory 157 can be any of a variety of non-volatile memory types, such as read-only memory (ROM), flash electrically erasable programmable ROM (EEPROM), and the like.

USB system 160 includes a USB hub 162 connected to a USB master in data processor 110, and representative USB devices 164, 166, and 168 each connected to USB hub 162. USB devices 164, 166, and 168 could be devices such as a keyboard, a mouse, a flash EEPROM port, and the like.

Disk drive 170 is connected to data processor 110 over a SATA bus and provides mass storage for the operating system, application programs, application files, and the like.

Data processing system 100 is suitable for use in modern computing applications by providing a memory channel 130 and a memory channel 140. Each of memory channels 130 and 140 can connect to state-of-the-art DDR memories such as DDR version four (DDR4), low power DDR4 (LPDDR4), graphics DDR version five (gDDR5), and high bandwidth memory (HBM), and can be adapted for future memory technologies. These memories provide high bus bandwidth and high speed operation. At the same time, they also provide low power modes to save power for battery-powered applications such as laptop computers, and also provide built-in thermal monitoring. As will be described in more detail below, data processor 110 includes a memory controller that is capable of throttling power in certain circumstances to avoid overheating and to reduce the chance of thermal overload.

Figure 2:
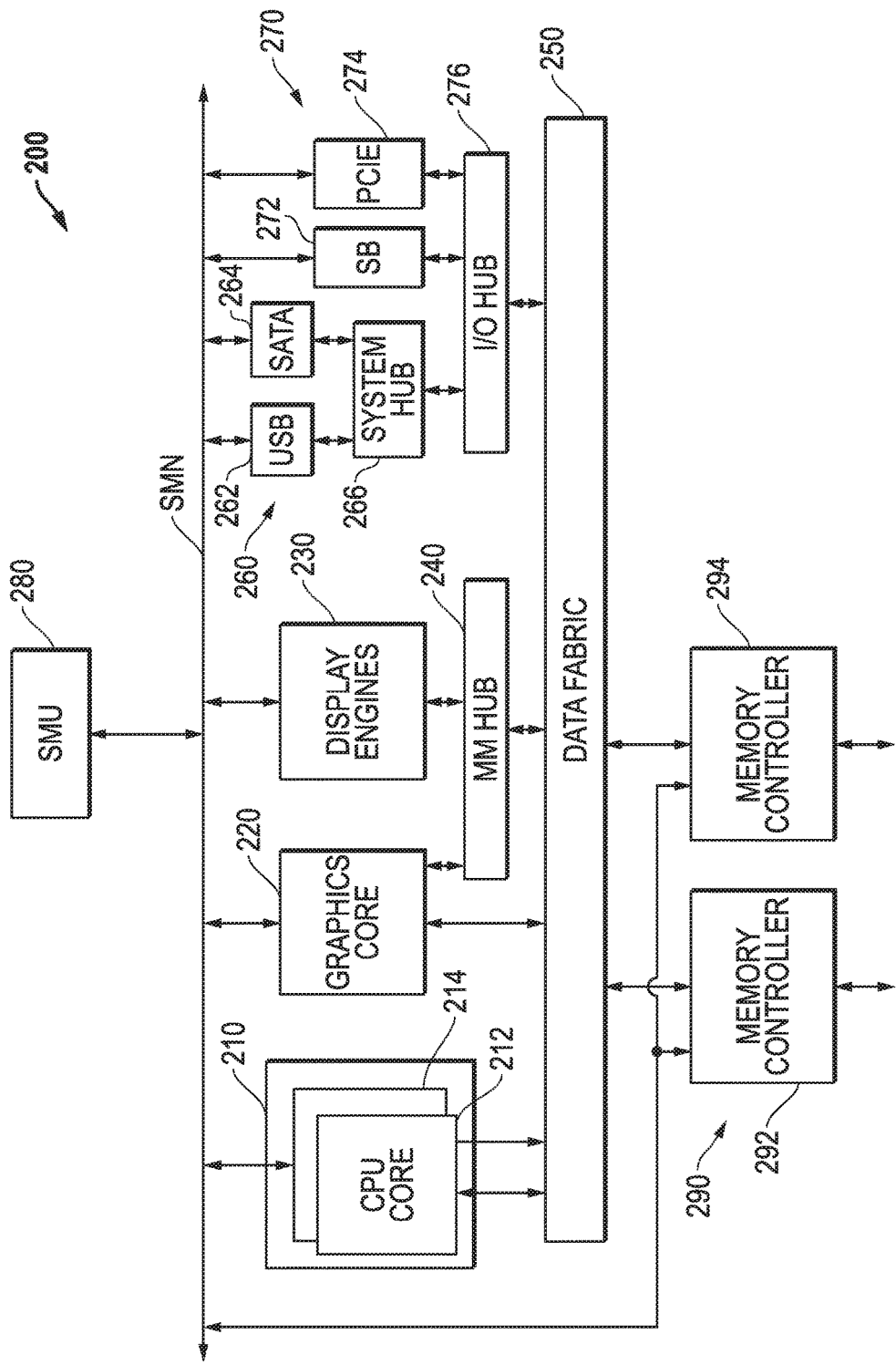
FIG. 2 illustrates in block diagram form an advanced processing unit (APU) suitable for use in the data processing system of FIG. 1.

FIG. 2 illustrates in block diagram form an APU 200 suitable for use in data processing system 100 of FIG. 1. APU 200 includes generally a central processing unit (CPU) core complex 210, a graphics core 220, a set of display engines 230, a memory management hub 240, a data fabric 250, a set of peripheral controllers 260, a set of peripheral bus controllers 270, a system management unit (SMU) 280, and a set of memory controllers 290.

CPU core complex 210 includes a CPU core 212 and a CPU core 214. In this example, CPU core complex 210 includes two CPU cores, but in other embodiments CPU core complex 210 can include an arbitrary number of CPU cores. Each of CPU cores 212 and 214 is bidirectionally connected to a system management network (SMN), which forms a control fabric, and to data fabric 250, and is capable of providing memory access requests to data fabric 250. Each of CPU cores 212 and 214 may be unitary cores, or may further be a core complex with two or more unitary cores sharing certain resources such as caches.

Graphics core 220 is a high performance graphics processing unit (GPU) capable of performing graphics operations such as vertex processing, fragment processing, shading, texture blending, and the like in a highly integrated and parallel fashion. Graphics core 220 is bidirectionally connected to the SMN and to data fabric 250, and is capable of providing memory access requests to data fabric 250. In this regard, APU 200 may either support a unified memory architecture in which CPU core complex 210 and graphics core 220 share the same memory space, or a memory architecture in which CPU core complex 210 and graphics core 220 share a portion of the memory space, while graphics core 220 also uses a private graphics memory not accessible by CPU core complex 210.

Display engines 230 render and rasterize objects generated by graphics core 220 for display on a monitor. Graphics core 220 and display engines 230 are bidirectionally connected to a common memory management hub 240 for uniform translation into appropriate addresses in memory system 120, and memory management hub 240 is bidirectionally connected to data fabric 250 for generating such memory accesses and receiving read data returned from the memory system.

Data fabric 250 includes a crossbar switch for routing memory access requests and memory responses between any memory accessing agent and memory controllers 290. It also includes a system memory map, defined by BIOS, for determining destinations of memory accesses based on the system configuration, as well as buffers for each virtual connection.

Peripheral controllers 260 include a USB controller 262 and a SATA interface controller 264, each of which is bidirectionally connected to a system hub 266 and to the SMN bus. These two controllers are merely exemplary of peripheral controllers that may be used in APU 200.

Peripheral bus controllers 270 include a system controller or "Southbridge" (SB) 272 and a PCIe controller 274, each of which is bidirectionally connected to an input/output (I/O) hub 276 and to the SMN bus. I/O hub 276 is also bidirectionally connected to system hub 266 and to data fabric 250. Thus for example a CPU core can program registers in USB controller 262, SATA interface controller 264, SB 272, or PCIe controller 274 through accesses that data fabric 250 routes through I/O hub 276.

SMU 280 is a local controller that controls the operation of the resources on APU 200 and synchronizes communication among them. SMU 280 manages power-up sequencing of the various processors on APU 200 and controls multiple off-chip devices via reset, enable and other signals. SMU 280 includes one or more clock sources not shown in FIG. 2, such as a phase locked loop (PLL), to provide clock signals for each of the components of APU 200. SMU 280 also manages power for the various processors and other functional blocks, and may receive measured power consumption values from CPU cores 212 and 214 and graphics core 220 to determine appropriate power states.

APU 200 also implements various system monitoring and power saving functions. In particular one system monitoring function is thermal monitoring. For example, if APU 200 becomes hot, then SMU 280 can reduce the frequency and voltage of CPU cores 212 and 214 and/or graphics core 220. If APU 200 becomes too hot, then it can be shut down entirely. Thermal events can also be received from external sensors by SMU 280 via the SMN bus, and SMU 280 can reduce the clock frequency and/or power supply voltage in response.

Figure 3:
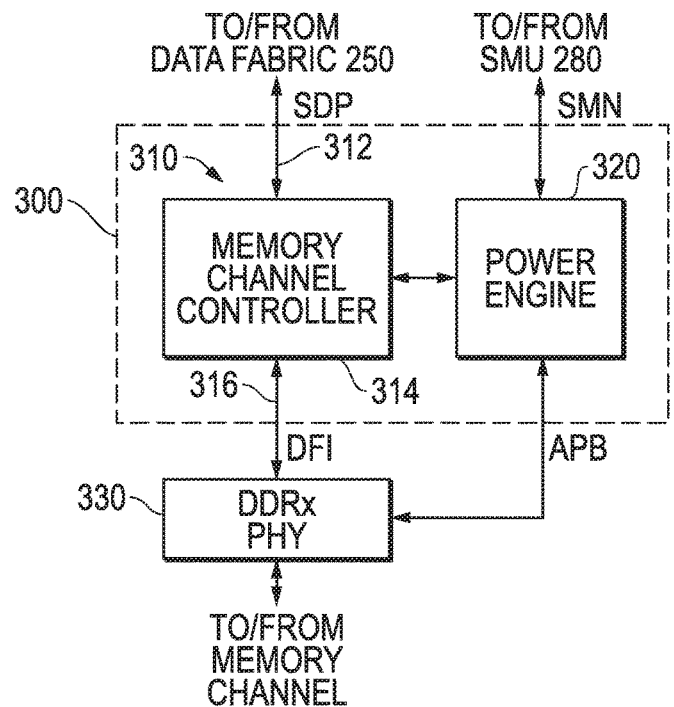
FIG. 3 illustrates in block diagram form a memory controller and associated physical interface (PHY) suitable for use in the APU of FIG. 2 according to some embodiments.

FIG. 3 illustrates in block diagram form a memory controller 300 and an associated physical interface (PHY) 330 suitable for use in APU 200 of FIG. 2 according to some embodiments. Memory controller 300 includes a memory channel 310 and a power engine 320. Memory channel 310 includes a host interface 312, a memory channel controller 314, and a physical interface 316. Host interface 312 bidirectionally connects memory channel controller 314 to data fabric 250 over a scalable data port (SDP). Physical interface 316 bidirectionally connects memory channel controller 314 to PHY 330 over a bus that conforms to the DDR-PHY Interface Specification (DFI). Power engine 320 is bidirectionally connected to SMU 280 over the SMN bus, to PHY 330 over the Advanced Peripheral Bus (APB), and is also bidirectionally connected to memory channel controller 314. PHY 330 has a bidirectional connection to a memory channel such as memory channel 130 or memory channel 140 of FIG. 1. Memory controller 300 is an instantiation of a memory controller for a single memory channel using a single memory channel controller 314, and has a power engine 320 to control operation of memory channel controller 314 in a manner that will be described further below.

Figure 4:
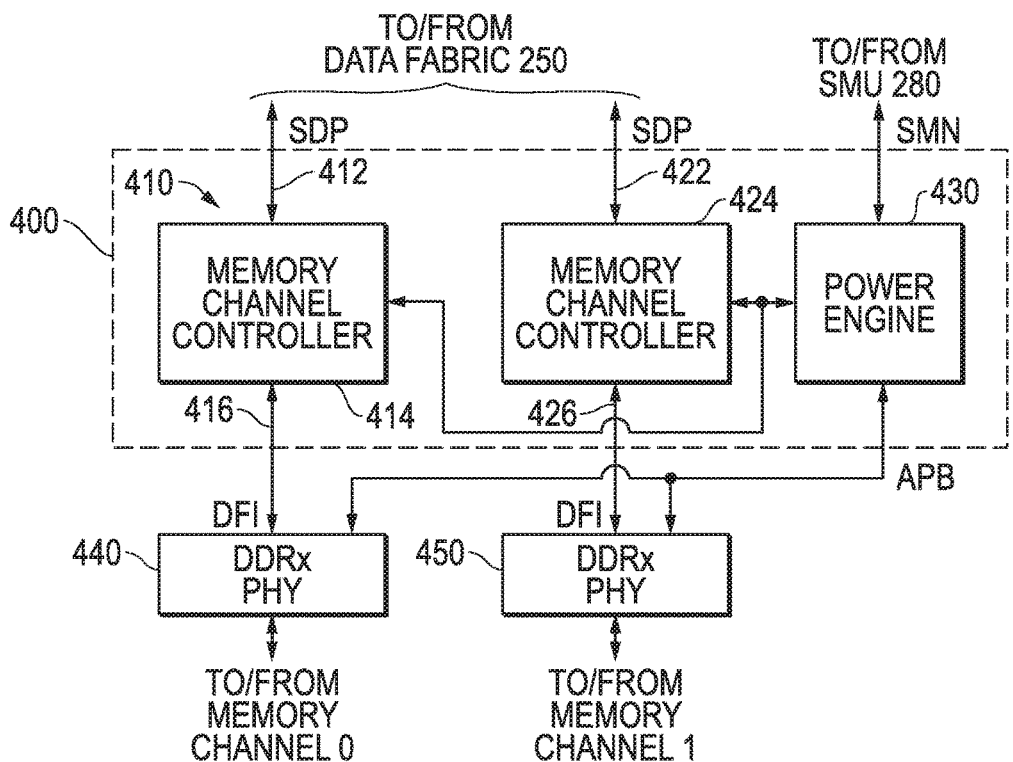
FIG. 4 illustrates in block diagram form another memory controller and associated PHY suitable for use in the APU of FIG. 2 according to some embodiments.

FIG. 4 illustrates in block diagram form another memory controller 400 and associated PHYs 440 and 450 suitable for use in APU 200 of FIG. 2 according to some embodiments. Memory controller 400 includes memory channels 410 and 420 and a power engine 430. Memory channel 410 includes a host interface 412, a memory channel controller 414, and a physical interface 416. Host interface 412 bidirectionally connects memory channel controller 414 to data fabric 250 over an SDP. Physical interface 416 bidirectionally connects memory channel controller 414 to PHY 440, and conforms to the DFI Specification. Memory channel 420 includes a host interface 422, a memory channel controller 424, and a physical interface 426. Host interface 422 bidirectionally connects memory channel controller 424 to data fabric 250 over another SDP. Physical interface 426 bidirectionally connects memory channel controller 424 to PHY 450, and conforms to the DFI Specification. Power engine 430 is bidirectionally connected to SMU 280 over the SMN bus, to PHYs 440 and 450 over the APB, and is also bidirectionally connected to memory channel controllers 414 and 424. PHY 440 has a bidirectional connection to a memory channel such as memory channel 130 of FIG. 1. PHY 450 has a bidirectional connection to a memory channel such as memory channel 140 of FIG. 1. Memory controller 400 is an instantiation of a memory controller having two memory channel controllers and uses a shared power engine 430 to control operation of both memory channel controller 414 and memory channel controller 424 in a manner that will be described further below.

Figure 5:
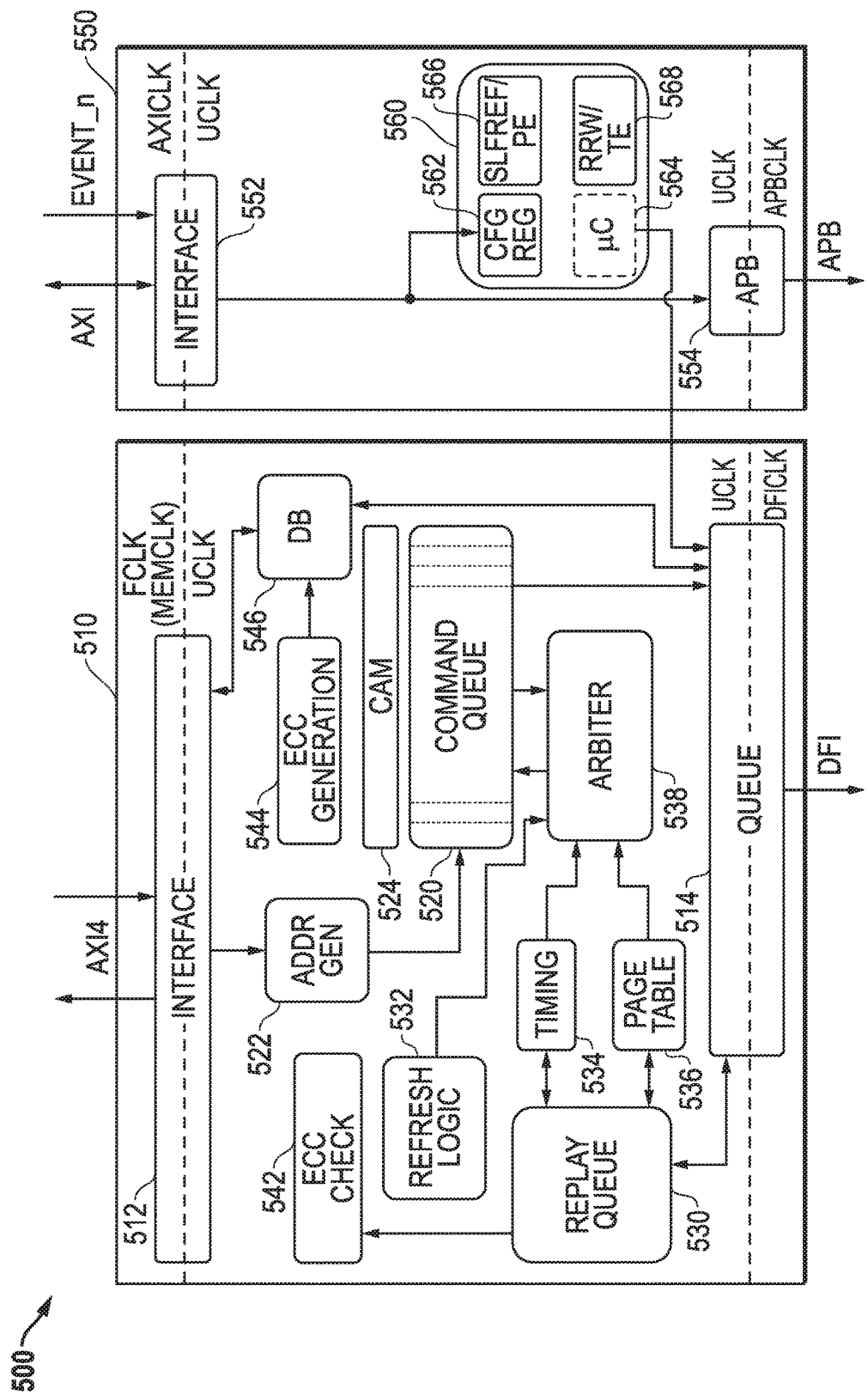
FIG. 5 illustrates in block diagram form a memory controller according to some embodiments.

FIG. 5 illustrates in block diagram form a memory controller 500 according to some embodiments. Memory controller 500 includes generally a memory channel controller 510 and a power controller 550. Memory channel controller 510 includes generally an interface 512, a queue 514, a command queue 520, an address generator 522, a content addressable memory (CAM) 524, a replay queue 530, a refresh logic block 532, a timing block 534, a page table 536, an arbiter 538, an error correction code (ECC) check block 542, an ECC generation block 544, and a write data buffer (WDB) 546.

Interface 512 has a first bidirectional connection to data fabric 250 over an external bus, and has an output. In memory controller 500, this external bus is compatible with the advanced extensible interface version four specified by ARM Holdings, PLC of Cambridge, England, known as "AXI4", but can be other types of interfaces in other embodiments. Interface 512 translates memory access requests from a first clock domain known as the FCLK (or MEMCLK) domain to a second clock domain internal to memory controller 500 known as the UCLK domain. Similarly, queue 514 provides memory accesses from the UCLK domain to the DFICLK domain associated with the DFI interface.

Address generator 522 decodes addresses of memory access requests received from data fabric 250 over the AXI4 bus. The memory access requests include access addresses in the physical address space represented in a normalized format. Address generator 522 converts the normalized addresses into a format that can be used to address the actual memory devices in memory system 120, as well as to efficiently schedule related accesses. This format includes a region identifier that associates the memory access request with a particular rank, a row address, a column address, a bank address, and a bank group. On startup, the system BIOS queries the memory devices in memory system 120 to determine their size and configuration, and programs a set of configuration registers associated with address generator 522. Address generator 522 uses the configuration stored in the configuration registers to translate the normalized addresses into the appropriate format. Command queue 520 is a queue of memory access requests received from the memory accessing agents in data processing system 100, such as CPU cores 212 and 214 and graphics core 220. Command queue 520 stores the address fields decoded by address generator 522 as well other address information that allows arbiter 538 to select memory accesses efficiently, including access type and quality of service (QoS) identifiers. CAM 524 includes information to enforce ordering rules, such as write after write (WAW) and read after write (RAW) ordering rules.

Replay queue 530 is a temporary queue for storing memory accesses picked by arbiter 538 that are awaiting responses, such as address and command parity responses, write cyclic redundancy check (CRC) responses for DDR4 DRAM or write and read CRC responses for gDDR5 DRAM. Replay queue 530 accesses ECC check block 542 to determine whether the returned ECC is correct or indicates an error. Replay queue 530 allows the accesses to be replayed in the case of a parity or CRC error of one of these cycles.

Refresh logic 532 includes state machines for various powerdown, refresh, and termination resistance (ZQ) calibration cycles that are generated separately from normal read and write memory access requests received from memory accessing agents. For example, if a memory rank is in precharge powerdown, it must be periodically awakened to run refresh cycles. Refresh logic 532 generates refresh commands periodically to prevent data errors caused by leaking of charge off storage capacitors of memory cells in DRAM chips. In addition, refresh logic 532 periodically calibrates ZQ to prevent mismatch in on-die termination resistance due to thermal changes in the system.

Arbiter 538 is bidirectionally connected to command queue 520 and is the heart of memory channel controller 510. It improves efficiency by intelligent scheduling of accesses to improve the usage of the memory bus. Arbiter 538 uses timing block 534 to enforce proper timing relationships by determining whether certain accesses in command queue 520 are eligible for issuance based on DRAM timing parameters. For example, each DRAM has a minimum specified time between activate commands, known as "$t_{RC}$". Timing block 534 maintains a set of counters that determine eligibility based on this and other timing parameters specified in the JEDEC specification, and is bidirectionally connected to replay queue 530. Page table 536 maintains state information about active pages in each bank and rank of the memory channel for arbiter 538, and is bidirectionally connected to replay queue 530.

In response to write memory access requests received from interface 512, ECC generation block 544 computes an ECC according to the write data. DB 546 stores the write data and ECC for received memory access requests. It outputs the combined write data/ECC to queue 514 when arbiter 538 picks the corresponding write access for dispatch to the memory channel.

Power controller 550 generally includes an interface 552 to an advanced extensible interface, version one (AXI), an APB interface 554, and a power engine 560. Interface 552 has a first bidirectional connection to the SMN, which includes an input for receiving an event signal labeled "EVENT_n" shown separately in FIG. 5, and an output. APB interface 554 has an input connected to the output of interface 552, and an output for connection to a PHY over an APB. Power engine 560 has an input connected to the output of interface 552, and an output connected to an input of queue 514. Power engine 560 includes a set of configuration registers 562, a microcontroller (μC) 564, a self refresh controller (SLFREF/PE) 566, and a reliable read/write timing engine (RRW/TE) 568. Configuration registers 562 are programmed over the AXI bus, and store configuration information to control the operation of various blocks in memory controller 500. Accordingly, configuration registers 562 have outputs connected to these blocks that are not shown in detail in FIG. 5. Self refresh controller 566 is an engine that allows the manual generation of refreshes in addition to the automatic generation of refreshes by refresh logic 532. Reliable read/write timing engine 568 provides a continuous memory access stream to memory or I/O devices for such purposes as DDR interface maximum read latency (MRL) training and loopback testing.

Memory channel controller 510 includes circuitry that allows it to pick memory accesses for dispatch to the associated memory channel. In order to make the desired arbitration decisions, address generator 522 decodes the address information into predecoded information including rank, row address, column address, bank address, and bank group in the memory system, and command queue 520 stores the predecoded information. Configuration registers 562 store configuration information to determine how address generator 522 decodes the received address information. Arbiter 538 uses the decoded address information, timing eligibility information indicated by timing block 534, and active page information indicated by page table 536 to efficiently schedule memory accesses while observing other criteria such as QoS requirements. For example, arbiter 538 implements a preference for accesses to open pages to avoid the overhead of precharge and activation commands required to change memory pages, and hides overhead accesses to one bank by interleaving them with read and write accesses to another bank. In particular during normal operation, arbiter 538 normally keeps pages open in different banks until they are required to be precharged prior to selecting a different page.

Figure 6:
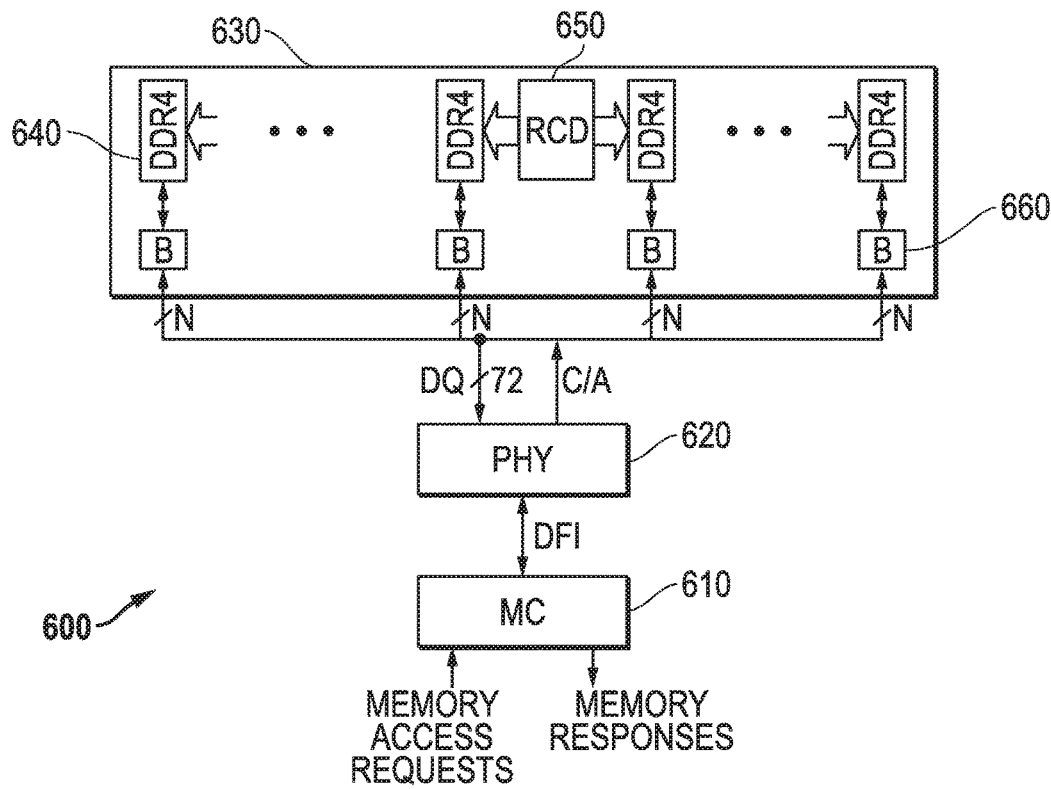
FIG. 6 illustrates in block diagram form a data processing system corresponding to portions of the data processing system of FIG. 1 according to some embodiments.

FIG. 6 illustrates in block diagram form a data processing system 600 corresponding to portions of data processing system 100 of FIG. 1 according to some embodiments. Data processing system 600 includes generally a memory controller labeled "MC" 610, a PHY 620, and a memory module 630.

Memory controller 610 receives memory access requests from and provides memory responses to a memory accessing agent of the processor, such as CPU core 212 or graphics core 220. Memory controller 610 corresponds to either one of memory controllers 290 of FIG. 2. Memory controller 610 outputs memory accesses to and receives responses from PHY 620 over a DFI-compatible bus.

PHY 620 is connected to memory controller 610 over the DFI bus. It performs the physical signaling in response to received memory accesses by providing a set of command and address outputs labeled "C/A" and a set of 72 bidirectional data signals labeled "DQ", including 64 bits of data and 8 bits of ECC.

Memory module 630 can support any of a number of memory types and speed grades. In the illustrated embodiment, memory module 630 is a DDR4 registered DIMM (RDIMM) that includes a set of memory chips 640 each labeled "DDR4", a register clock driver 650 labeled "RCD", and a set of buffers 660 each labeled "B". Memory chips 640 include an M-bit set of by-N memory chips. To support 72 data signals (64 bits of data plus 8 bits of ECC), M*N=72. For example if each memory chip is by-four (N=4), then memory module 620 includes 18 DDR4 memory chips. Alternatively if each memory chip is by-eight (N=8), then memory module 620 includes 9 DDR4 memory chips. Each of buffers 660 is associated with one by-N memory chip and is used to latch the corresponding N bits of data. In the example shown in FIG. 6, memory module 630 contains DDR4 memory, and the C/A signals include those signals described in the DDR4 Specification. The DDR4 Specification specifies a "fly-by" architecture in which the same C/A signals that are received and latched by RCD 650 are re-driven left and right to each of memory chips 640. However data signals DQ are provided only to corresponding buffers and memories.

Memory module 630 operates according to control information for RCD 650 programmed into the register control word (RCW) and for buffers 660 programmed into the buffer control word (BCW). Thus when memory controller 610 places memory module 630 into a low power state, it also changes the settings in the RCW and BCW, in a manner that will be described more fully below.

While data processing system 600 uses a registered, buffered DDR4 DRAM DIMM as memory module 630, memory controller 610 and PHY 620 are also able to interface to several different types of memory modules. In particular, memory controller 610 and PHY 620 are able to support several different types of memory (e.g., DDR, FLASH, PCM, etc.), several different register conditions (none used, RCD, flash controller, etc.) and several different buffer conditions (none used, data buffer only, etc.) such that memory controller 610 supports a wide variety of combinations of memory type, register condition, and buffer condition. To support these combinations, memory controller 610 implements an architecture that allows unique plans for entering and exiting low power modes that system BIOS can program for the specific memory system characteristics. These features will now be described.

Figure 7:
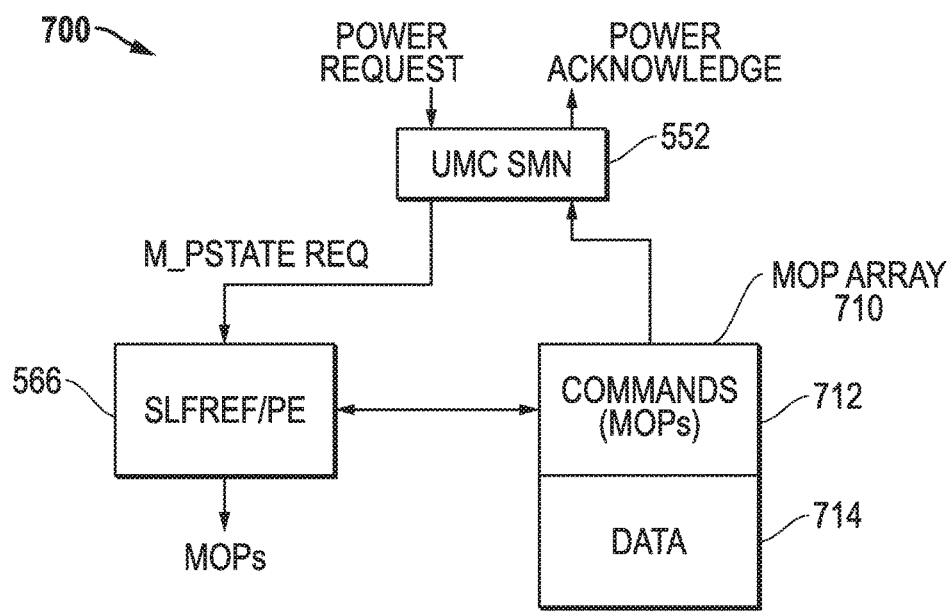
FIG. 7 illustrates in block diagram form a memory channel controller corresponding to portions of the memory channel controller of FIG. 5 according to some embodiments.

FIG. 7 illustrates in block diagram form a memory channel controller 700 corresponding to portions of memory channel controller 550 of FIG. 5 according to some embodiments. Memory channel controller 700 includes UMCSMN 552 and self refresh controller 566 as illustrated in FIG. 5 above, and a memory operation (MOP) array 710. UMCSMN 552 has a first port for connection to the SMN as described above, and as shown in pertinent detail here has an input for receiving a power state change request signal labeled "POWER REQUEST" from data fabric 250, and an output for providing a power state change acknowledge signal labeled "POWER ACKNOWLEDGE" to data fabric 250. UMCSMN 552 also has a second port with a first output for providing a memory power state change request signal labeled "M_PSTATE REQ" and a second output for providing data for storage in MOP array 710. Self refresh controller 566 has an input connected to the first output of the second port of UMCSMN 552, a bidirectional port, and an output connected to BEQ 514 for providing decoded MOPs to BEQ 514. MOP array 710 has an input connected to the second output of the second port of UMCSMN 552, and a bidirectional connection to self refresh controller 566 and is divided into a first portion 712 for storing commands (i.e. MOPs), and a second portion 714 for storing data.

On startup, the system BIOS stored in system BIOS memory 157 queries memory system 120 to determine the type of memory that has been installed and its capabilities. It typically does so by reading registers in the serial presence detect (SPD) memory on each DIMM present in the system. For example, the PHY may be configured to support any one of DDR3, DDR4, low power DDR4 (LPDDR4), and graphics DDR version five (gDDR5) memory. In response to detecting the type and capabilities of memory installed in memory system 120, the system BIOS populates MOP array 710 with a sequence of commands that initiate entry into and exit from supported low power modes for the particular type of memory.

In the illustrated embodiment, memory channel controller 550 supports various device low power states defined according to the model described by the Advanced Configuration and Power Interface (ACPI) Specification. According to the ACPI Specification, the working state of a device (such as memory controller 500) is known as the D0 state or the "fully on" state. The other states are low power states and include the D1, D2, and D3 states, in which the D3 state is the "off" state. Memory controller 500 is capable of placing memory system 120 into low power states corresponding to the D state of memory controller 500 as well as making frequency and/or voltage changes in the D0 state. Upon receipt of a POWER REQUEST, UMCSMN 552 provides the M_PSTATE REQ signal to self refresh controller 566 to indicate which power state is requested. Self refresh controller 566 accesses MOP array 710 in response to execute a sequence of MOPs that place the memory chips and the RCW and BCW of the DIMM (if supported) in the appropriate states for the requested D state. Self refresh controller 566 outputs indexes into MOP array 710, and MOP array 710 returns encoded commands (MOPs) in response.

By including MOP array 710 to store programmable commands that form firmware for self refresh controller 566, memory channel controller 550 is implemented using a relatively small amount of circuit area while supporting a wide variety of memory types with different characteristics. Moreover it provides an upward compatible architecture that allows memory state changes for memory types and characteristics that are not yet specified but may be specified in the future. Thus memory channel controller 550 is also modular and avoids the need for a costly future redesign.

The interaction between these memory controller device power states (D-states) and the DRAM operation will now be described. The D0 state is the operational state for memory controller 500. In the D0 state, memory controller 500 supports four programmable power states (P-states) each having a different MEMCLK frequency and associated timing parameters. Memory controller 500 maintains a set of registers for each P-state storing timing parameters for that P-state and defining a context. Memory controller 500 places the DRAMs into the self refresh mode to change P-states/contexts. MOP array 710 includes a set of commands for use with a frequency change in the D0 state to support the proper sequencing.

The D1 state is known as the stopclock state and is used for memory state change requests. When memory controller 500 is placed in the D1 state, entry and exit latency are the lowest, except when it is necessary to retrain PHY 620. Memory controller 500 typically does not flush any arbitration queue entries as a result of a D1 power state change request. However, memory controller 500 flushes all writes in command queue 520 beforehand, while normal pending refreshes are typically not executed. Memory controller 500 places all memory chips in the system into either precharge power down or self refresh.

The D2 state is known as the standby state and corresponds to system C1/C2/C3 and stop-clock/stutter states. It is a lower power state for the operation of memory controller 500 itself. In the D2 state, memory controller 500 uses local clock gating and optional power gating to further reduce power. Memory controller 500 flushes both writes and reads from command queue 520. In the D2 state memory controller 500 likewise places all memory in the system into precharge power down with auto self refresh enabled. However since D2 is a deeper power state, it performs all soon to be required ("owed") refreshes prior to entry into precharge power down with auto self refresh.

The D3 state is known as the suspend state. Memory controller 500 supports two D3 states. The first D3 state is used for system S3 state. Memory controller 500 places DRAMs and PHYs into the lowest power state in anticipation of entering system S3 state. Memory controller 500 typically flushes writes from command queue 520, and executes pending refresh cycles. The second D3 state is used for asynchronous DRAM refresh (ADR-style self refresh. ADR is a feature used in servers to flush pending write data into a non-volatile memory during a power failure or system crash. DRAMs and PHYs are again placed into precharge power down with auto self refresh enabled.

As used here, the POWER REQUEST signal indicates a change from any one power state to a different power state. The available power states differ between different memory types. Moreover as used herein, a "low power state" means a state that saves power compared to another state. For example, DDR4 SDRAM supports two low power states known as self refresh and precharge power down. LPDDR4, however, supports three low power states known as active power down, self refresh power down, and idle power down. The conditions in which these states can be entered and exited are different and are specified in the state diagrams of the corresponding published JEDEC standards, and "low power state" encompasses any of these states.

MOP array 710 supports a command format that allows the efficient encoding of commands to support all of these power state changes. MOP array 710 uses two arrays known as "SrEnterMOP" and "SrExitMOP" for each of the four P-state contexts. SrEnterMOP is processed before entering self-refresh for a P-state request. SrExitMOP is processed after exiting self-refresh for a P-state request. The MOP array specifies a sequential list of mode register (MR), MR with per-DRAM accessibility (PDA), register control word (RCW), or buffer control word (BCW) commands. Upon receipt of a power state change request, self refresh controller 566 accesses the commands for the selected context in MOP array 710 to determine the sequence and timing of MOPs issued to the memory system.

The MOPs in portion 712 include fields that signify the corresponding D-state or states. Thus self refresh controller 566 scans MOP array 712 starting from the first location for commands that are applicable to the particular context, ignoring MOPs that are not applicable to the current context. MOP array 712 also includes counter values to determine, when appropriate, proper timing between MOPs to satisfy dynamic timing parameters of the memory chips. After beginning a command sequence, self refresh controller 566 continues scanning MOP array 712 and executing valid commands until it encounters a null entry, which indicates the end of the sequence for the power state change. An example of fields of MOP array 712 that can be used to enable the efficient storage of commands for power state changes will now be described.

Figure 8:
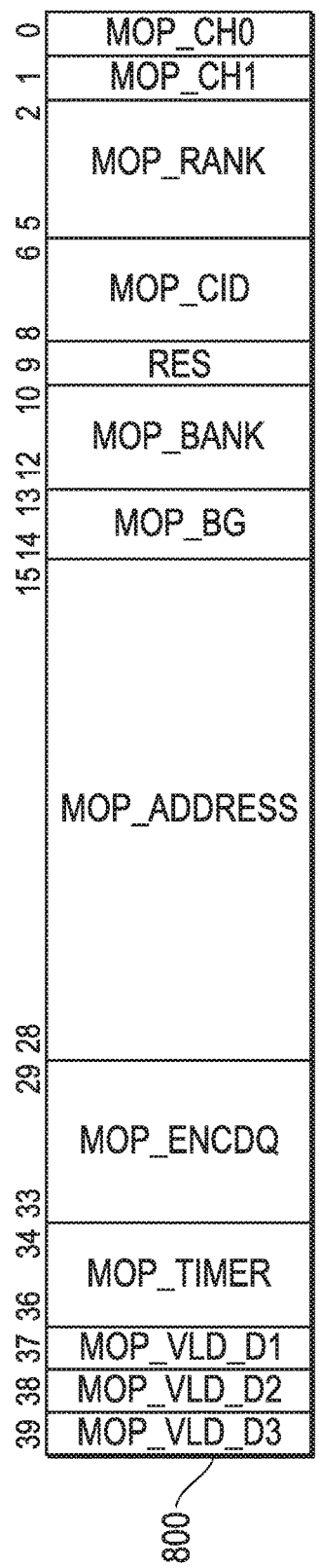
FIG. 8 illustrates in block diagram form an entry of the MOP array of FIG. 7 according to some embodiments.

FIG. 8 illustrates in block diagram form an entry 800 of MOP array 710 of FIG. 7 according to some embodiments. Entry 800 is a 40-bit entry that includes a variety of encoded bit fields that define a MOP. The supported bit fields are shown in TABLE I below:

TABLE I

| Bit(s) | Field Name | Field Definition |
|---|---|---|
| 0 | MOP_CH0 | 1 = Send command to sub-channel 0 in virtual controller mode (VCM). Send command on even MEMCLK cycle in non-VCM mode. |
| 1 | MOP_CH1 | 1 = Send command to sub-channel 1 in VCM mode. Send command on odd MEMCLK cycle in non-VCM mode. |
| 5-2 | MOP_RANK | Positive polarity chip select map for root chip selects. |
| 8-6 | MOP_CID | DDR4 CID value for the transaction. |
| 9 | RES | Reserved. |
| 12-10 | MOP_BANK | Bank address for the command. |
| 14-13 | MOP_BG | BG for the command. |
| 28-15 | MOP_ADDRESS | Address[13:0]. This field includes bit settings for mode register set (MRS) commands. |
| 33-29 | MOP_ENCDQ | Encode DQ. A zero value specifies a normal, non-PDA or non-PBA MRS/RCW/BCW command. A non-zero value specifies special sequence of pre-determined commands. |
| 36-34 | MOP_TIMER | Encoded timer. |
| 37 | MOP_VLD_D1 | Array entry is valid for D1 state (MstateReq). 1 = Send this command if the request is for D1; 0 = Skip command during D1 requests. |
| 38 | MOP_VLD_D2 | Array entry is valid for D2 state. 1 = Send this command if the request is for D2; 0 = Skip command during D2 requests. |
| 39 | MOP_VLD_D3 | Array entry is valid for D3 state. 1 = Send this command if the request is for D3; 0 = Skip command during D3 requests. |

MOP array 712 has various programming requirements to be followed so that self refresh controller 566 will properly decode and issue the required MOPs for any allowed state change. Self refresh controller 566 decodes and issues MOPs linearly, with no branching, until the first null entry is read from the array. A null entry is an entry in which all of bits of the MOP_RANK and all bits of the MOP_CID are zeros. Therefore when system BIOS programs MOP array 712, it should program at least one null entry for each context.

MOPs can be shared by different D-states by setting more than one of MOP_VLD_D1, MOP_VLD_D2, and MOP_VLD_D3. MOPs are skipped by particular D-states by clearing the corresponding one of MOP_VLD_D1, MOP_VLD_D2, and MOP_VLD_D3.

The D-state entry routine (SrEnterMOP) has certain requirements. It must include commands to disable parity if parity is enabled. The recommended order for registered DIMMs (RDIMMs) is first to disable parity in the DRAM chips, and then to disable parity in the buffer. It must also include commands to program the command-to-command delay time ($t_{CCD}$), which according to the DDR4 Specification is programmed by setting the time in Mode Register 6 (MR6) bits 12-10. In addition, for systems with RDIMMs, it must include commands to program target register control words RC0A and RC3x.

The D-state exit routine (SrExitMOP) also has certain requirements. It must include commands to enable parity if parity is enabled. The recommended configuration for RDIMMs is to enable parity only in the register.

A single MOP entry is expected to target multiple chip selects. It is recommended that MOP_Rank reflects all populated chip selects, unless even/odd chip selects intentionally receive asymmetric settings. In this regard, BEQ 514 has modes to allow inversion and mirroring, such that it converts a single MOP into two commands if inversion is enabled, and into four commands if both inversion and mirroring are enabled. For example for a quad-rank DIMM, two MOP entries can be used per mode register set command for a quad-rank RDIMM with encoded chip selects.

MOP array 712 supports various fields that allow efficient encoding of commands and thus allows it to be implemented with a small size. For example the command scanning technique that self refresh controller 566 uses to access MOP array 712 allows particular commands to be used for multiple low power states without having to replicate the commands for each low power state. Moreover using a null entry to signal the termination condition is an efficient way to encode the end of each command sequence without requiring self refresh controller 566 to compute entry and exit points based on the desired state change and context.

Thus a memory controller as described herein uses a controller and a programmable MOP array to support any of a wide variety of available memory types and DIMM configurations. The controller is responsive to an activation of a power state change request signal to access the MOP array to fetch at least one entry, and to issue at least one memory operation indicated by the entry to effect the power state change request. As so constituted the MOP array allows the memory controller to support a wide variety of memory types and configurations using a compact circuit. Moreover the system BIOS can determine the configuration of the memory at startup and program the MOP array with a set of entries corresponding to the power state change actions of the particular type of memory in the system.

The memory controller may be implemented with various combinations of hardware and software. Some of the software components, such as those stored in BIOS memory and loaded by system BIOS into the MOP array, may be stored in a non-transitory computer readable storage medium for execution by at least one processor. Moreover some of the common operations used in power state changes may be implemented in other hardware such as microcontroller 564 to simplify the number and/or size of fields of the MOP array.

Memory controller 500 of FIG. 5 or any portions thereof may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates that also represent the functionality of the hardware comprising integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, the range of memory devices supported will vary in different embodiments, and is not limited to the examples described above. Moreover the field definitions of the MOP array will vary in different embodiments. In addition while MOP array 710 was described as having fields indicating particular power states to which an entry applies, in other embodiments the MOP array can be organized with entry and exit addresses corresponding to particular supported power state change requests or target power spaces.

Accordingly, it is intended by the appended claims to cover all modifications of the disclosed embodiments that fall within the scope of the disclosed embodiments.

What is claimed is:

1. A memory controller comprising:
a controller having an input for receiving a power state change request signal and an output for providing memory operations; and
a memory operation array comprising a plurality of entries, each of said entries comprising a plurality of encoded fields, wherein said memory operation array is programmable to store different sequences of commands for particular types of memory of a plurality of types of memory in said plurality of entries that initiate entry into and exit from supported low power modes for the particular types of memory,
wherein said controller is responsive to an activation of said power state change request signal to access said memory operation array to fetch at least one entry, and to issue at least one memory operation indicated by said at least one entry.

2. The memory controller of claim 1 wherein said memory operations comprise mode register set (MRS) commands for a double data rate (DDR) memory module.

3. The memory controller of claim 2 wherein said memory operations comprise register control word write commands to configure a register of said DDR memory module.

4. The memory controller of claim 3 wherein said memory operations comprise buffer control word write commands to configure a data buffer of said DDR memory module.

5. The memory controller of claim 1 wherein said plurality of entries comprises at least one valid entry and a subsequent null entry.

6. The memory controller of claim 1 wherein one of said plurality of encoded fields comprises a power state field indicating which of at least one memory device power state corresponds to said at least one entry.

7. The memory controller of claim 6 wherein said at least one memory device power state corresponds to one of: a dynamic voltage state, a dynamic frequency state, and a low power state.

8. The memory controller of claim 6 wherein said at least one memory device power state corresponds to a selected one of an advanced power configuration interface (ACPI) D1 state, an ACPI D2 state, and an ACPI D3 state, wherein said ACPI D3 state corresponds to a self refresh state of a double data rate memory.

9. A method for controlling a power state of a memory system comprising:
populating a memory operation (MOP) array with a sequence of programmable commands for particular types of memory of a plurality of types of memory that initiate entry into and exit from supported low power modes for the particular types of memory;
receiving a power state change request signal;
accessing said MOP array in response to said power state change request signal;
decoding an entry of said MOP array into at least one memory operation;
outputting said at least one memory operation; and
repeating said decoding and said outputting for successive entries in said MOP array until a predetermined termination condition occurs.

10. The method of claim 9 wherein said predetermined termination condition exists when a successive entry is a null entry.

11. The method of claim 9 wherein:
said power state change request signal is a request to change from an active state to a low power state.

12. The method of claim 9 wherein:
said power state change request signal is a request to change from a first operating frequency to a second operation frequency in an active state.

13. The method of claim 9 wherein said populating comprises:
storing a series of operations in said MOP array in response to detecting characteristics of said memory system.

14. The method of claim 13 wherein:
said storing comprises storing said series of operations in said MOP array under control of a basic input/output system (BIOS).

15. An apparatus for controlling power state transitions of a memory comprising:
a controller having an input for receiving a power state change request signal and an output for providing memory operations; and
a memory operation array comprising a plurality of entries, each of said entries comprising a plurality of encoded fields, wherein said memory operation array is programmable to store different sequences of commands for particular types of memory of a plurality of types of memory in said plurality of entries that initiate entry into and exit from supported low power modes for the particular types of memory,
wherein said controller is responsive to an activation of said power state change request signal to access said memory operation array to fetch at least one entry, and to issue at least one memory operation indicated by said at least one entry.

16. The apparatus of claim 15, further comprising:
a system management unit for activating said power state change request signal in response to a dynamic operation of a processor.

17. The apparatus of claim 15, wherein said memory operations comprise mode register set (MRS) commands for a double data rate (DDR) memory module.

18. The apparatus of claim 15, wherein said plurality of entries comprises at least one valid entry and a subsequent null entry.

19. The apparatus of claim 15, wherein one of said plurality of encoded fields comprises a power state field indicating which of at least one memory device power state corresponds to said at least one entry.

20. The apparatus of claim 19, wherein said at least one memory device power state corresponds to one of: a dynamic voltage state, a dynamic frequency state, and a low power state.

* * * * *